United States Patent [19]

Tamegai

[11] Patent Number: 5,442,614
[45] Date of Patent: Aug. 15, 1995

[54] METHOD OF RECORDING DATA AND INFORMATION REGARDING DEFECTS

[75] Inventor: Masahiro Tamegai, Koga, Japan

[73] Assignee: Canon Kabushiki Kaisha, Tokyo, Japan

[21] Appl. No.: 351,066

[22] Filed: Nov. 30, 1994

Related U.S. Application Data

[63] Continuation of Ser. No. 942,403, Sep. 9, 1992, abandoned.

[30] Foreign Application Priority Data

Sep. 13, 1991 [JP] Japan .................. 3-261425
Oct. 21, 1991 [JP] Japan .................. 3-299606
Mar. 6, 1992 [JP] Japan .................. 4-083055

[51] Int. Cl.⁶ ............................... G11B 7/00
[52] U.S. Cl. ........................ 369/58; 369/47; 235/456
[58] Field of Search ............ 235/454, 456; 369/32, 369/47–50, 54, 58, 59, 124

[56] References Cited

U.S. PATENT DOCUMENTS 5,107,481  4/1992  Miki et al. .................. 369/59
5,111,444  5/1992  Fukushima et al. .......... 369/58

FOREIGN PATENT DOCUMENTS 0203562  12/1986  European Pat. Off. .
0261918   3/1988  European Pat. Off. .
0284273   9/1988  European Pat. Off. .
0303377   2/1989  European Pat. Off. .
61-243994 10/1986  Japan .

OTHER PUBLICATIONS

Patent Abstracts of Japan, vol. 11, No. 93, (P-559), Mar. 24, 1987, & JP61-243994.
Norton, et al., "The New Peter Norton Programmer's Guide to the IBM PC & PS/2", pp. 106–121, Microsoft Press, Redmond, Wash., 1988.
Watkinson, "The Art of Digital Video", pp. 498–502, Focal Press, Sevenoaks Kent, England, 1990.

Primary Examiner—W. R. Young
Attorney, Agent, or Firm—Fitzpatrick, Cella, Harper & Scinto

[57] ABSTRACT

A method of recording information on an information recording medium including a first area having a plurality of sectors for recording data and a second area having a plurality of blocks for recording a directory used for managing the data is disclosed. Data is recorded on a first sector group consisting of at least one sector in the first area of the medium. When there is a defect in at least a part of the first sector group, the data to be recorded is recorded on a second sector group consisting of at least one sector in the first area. A directory corresponding to the data is recorded in the first block of the second area of the medium. When there is a defect in the first sector group, information regarding the defect is recorded into the first block of the second area. When only a part of the information regarding the defect can be recorded in the first block, the remaining information regarding the defect is recorded into the second block of the second area.

7 Claims, 14 Drawing Sheets

FIG. 4A

USER DIRECTORY

| BYTE | |
|---|---|
| 0~3 | HEADER "DIRU" |
| 4, 5 | SYSTEM DIRECTORY NUMBER |
| 6, 7 | USER DIRECTORY NUMBER |
| 8, 9 | START LOGICAL SECTOR ADDRESS |
| 10, 11 | MANAGEMENT LOGICAL SECTOR NUMBER |
| 12, 13 | START PHYSICAL SECTOR ADDRESS |
| 14, 15 | MANAGEMENT PHYSICAL SECTOR NUMBER |
| | DEFECT LIST 1 |
| 16, 17 |   DEFECT START ADDRESS |
| 18, 19 |   CONTINUOUS DEFECTIVE SECTOR NUMBER |
| | DEFECT LIST 2 |
| 20, 21 |   DEFECT START ADDRESS |
| 22, 23 |   CONTINUOUS DEFECTIVE SECTOR NUMBER |
| | DEFECT LIST 3 |
| 24, 25 |   DEFECT START ADDRESS |
| 26, 27 |   CONTINUOUS DEFECTIVE SECTOR NUMBER |
| 28~59 | USER DIRECTORY DATA 32 BYTE |

FIG. 4B

SYSTEM DIRECTORY

| BYTE | |
|---|---|
| 0~3 | HEADER "DIRS" |
| 4, 5 | SYSTEM DIRECTORY NUMBER |
| 6, 7 | RESERVE (0) |
| 8, 9 | START LOGICAL SECTOR ADDRESS |
| 10, 11 | MANAGEMENT LOGICAL SECTOR NUMBER |
| 12, 13 | START PHYSICAL SECTOR ADDRESS |
| 14, 15 | MANAGEMENT PHYSICAL SECTOR NUMBER |
| | DEFECT LIST 1 |
| 16, 17 |   DEFECT START ADDRESS |
| 18, 19 |   CONTINUOUS DEFECTIVE SECTOR NUMBER |
| | DEFECT LIST 2 |
| 20, 21 |   DEFECT START ADDRESS |
| 22, 23 |   CONTINUOUS DEFECTIVE SECTOR NUMBER |
| | ⋮ |
| | DEFECT LIST 11 |
| 56, 57 |   DEFECT START ADDRESS |
| 58, 59 |   CONTINUOUS DEFECTIVE SECTOR NUMBER |

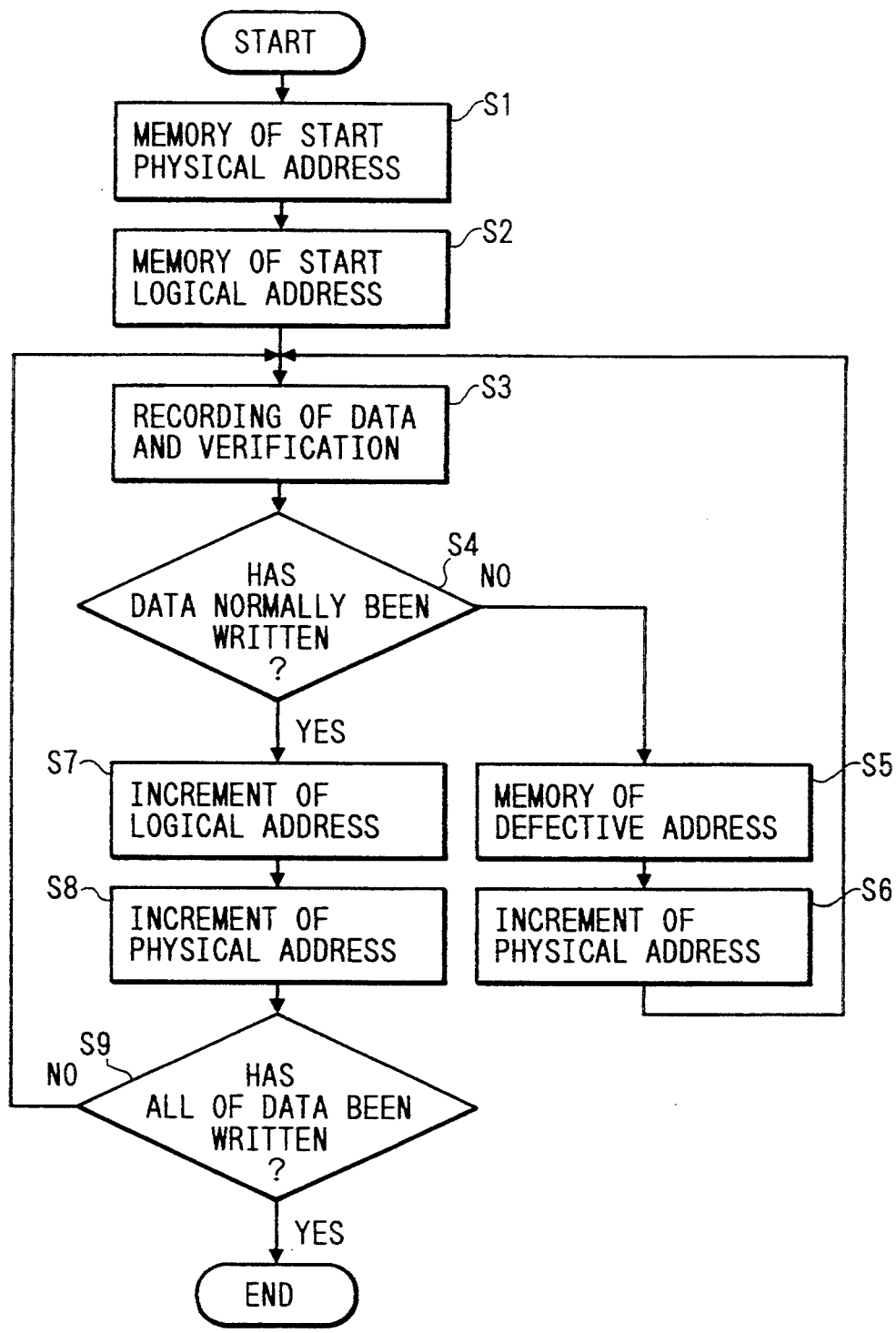

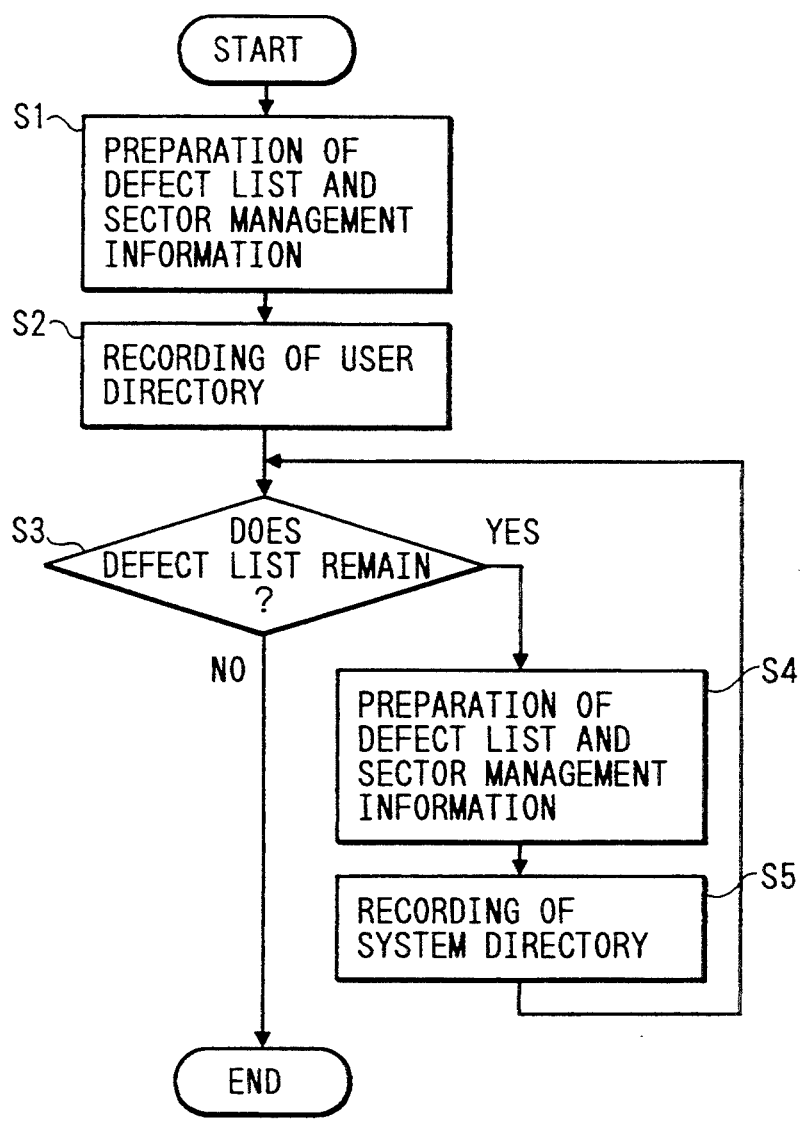

FIG. 7A

USER DIRECTORY FOR FILE F1

| "DIRU" |
|---|
| SYSTEM DIRECTORY NUMBER 1 |
| USER DIRECTORY NUMBER 1 |
| START LOGICAL SECTOR ADDRESS=1 |
| MANAGEMENT LOGICAL SECTOR NUMBER=6 |
| START PHYSICAL SECTOR ADDRESS=1 |
| MANAGEMENT PHYSICAL SECTOR NUMBER=8 |
| DEFECT LIST 1 DEFECT START ADDRESS=3 CONTINUOUS DEFECTIVE SECTOR NUMBER=2 |
| DEFECT LIST 2 DEFECT START ADDRESS=0 CONTINUOUS DEFECTIVE SECTOR NUMBER=0 |
| DEFECT LIST 3 DEFECT START ADDRESS=0 CONTINUOUS DEFECTIVE SECTOR NUMBER=0 |
| USER DIRECTORY DATA 32 BYTE |

FIG. 7B

USER DIRECTORY FOR FILE F2

| "DIRU" |
|---|
| SYSTEM DIRECTORY NUMBER 2 |
| USER DIRECTORY NUMBER 2 |
| START LOGICAL SECTOR ADDRESS=7 |
| MANAGEMENT LOGICAL SECTOR NUMBER=3 |
| START PHYSICAL SECTOR ADDRESS=9 |
| MANAGEMENT PHYSICAL SECTOR NUMBER=7 |
| DEFECT LIST 1 DEFECT START ADDRESS=9 CONTINUOUS DEFECTIVE SECTOR NUMBER=1 |
| DEFECT LIST 2 DEFECT START ADDRESS=11 CONTINUOUS DEFECTIVE SECTOR NUMBER=2 |
| DEFECT LIST 3 DEFECT START ADDRESS=14 CONTINUOUS DEFECTIVE SECTOR NUMBER=1 |
| USER DIRECTORY DATA 32 BYTE |

FIG. 7C

SYSTEM DIRECTORY FOR FILE F2

| "DIRS" |
|---|
| SYSTEM DIRECTORY NUMBER 3 |
| RESERVE (0) |
| START LOGICAL SECTOR ADDRESS=10 |
| MANAGEMENT LOGICAL SECTOR NUMBER=1 |
| START PHYSICAL SECTOR ADDRESS=16 |
| MANAGEMENT PHYSICAL SECTOR NUMBER=3 |
| DEFECT LIST 1 DEFECT START ADDRESS=16 CONTINUOUS DEFECTIVE SECTOR NUMBER=2 |
| DEFECT LIST 2 DEFECT START ADDRESS=0 CONTINUOUS DEFECTIVE SECTOR NUMBER=0 |
| ALL OF DEFECT LIST 3 TO DEFECT LIST 11 IS 0 IN THE FOLLOWING |

FIG. 9A

USER DIRECTORY FOR FILE F1

| "DIRU" |
|---|
| SYSTEM DIRECTORY NUMBER 1 |
| USER DIRECTORY NUMBER 1 |
| START LOGICAL SECTOR ADDRESS=1 |
| MANAGEMENT LOGICAL SECTOR NUMBER=6 |
| START PHYSICAL SECTOR ADDRESS=1 |
| MANAGEMENT PHYSICAL SECTOR NUMBER=8 |
| DEFECT LIST 1<br>   DEFECT START ADDRESS=3<br>   CONTINUOUS DEFECTIVE SECTOR NUMBER=2 |
| DEFECT LIST 2<br>   DEFECT START ADDRESS=0<br>   CONTINUOUS DEFECTIVE SECTOR NUMBER=0 |
| DEFECT LIST 3<br>   DEFECT START ADDRESS=0<br>   CONTINUOUS DEFECTIVE SECTOR NUMBER=0 |
| USER DIRECTORY DATA 32 BYTE |

FIG. 9B

SYSTEM DIRECTORY FOR FILE F2

| "DIRS" |
|---|
| SYSTEM DIRECTORY NUMBER 2 |
| RESERVE (0) |
| START LOGICAL SECTOR ADDRESS=7 |
| MANAGEMENT LOGICAL SECTOR NUMBER=4 |
| START PHYSICAL SECTOR ADDRESS=9 |
| MANAGEMENT PHYSICAL SECTOR NUMBER=10 |
| DEFECT LIST 1<br>   DEFECT START ADDRESS=9<br>   CONTINUOUS DEFECTIVE SECTOR NUMBER=1 |
| DEFECT LIST 2<br>   DEFECT START ADDRESS=11<br>   CONTINUOUS DEFECTIVE SECTOR NUMBER=2 |
| DEFECT LIST 3<br>   DEFECT START ADDRESS=14<br>   CONTINUOUS DEFECTIVE SECTOR NUMBER=1 |
| DEFECT LIST 4<br>   DEFECT START ADDRESS=16<br>   CONTINUOUS DEFECTIVE SECTOR NUMBER=2 |
| ALL OF DEFECT LIST 5 TO DEFECT LIST 11 IS 0 IN THE FOLLOWING |

FIG. 9C

USER DIRECTORY FOR FILE F2

| "DIRU" |
|---|
| SYSTEM DIRECTORY NUMBER 3 |
| USER DIRECTORY NUMBER 2 |
| START LOGICAL SECTOR ADDRESS=11 |
| MANAGEMENT LOGICAL SECTOR NUMBER=0 |
| START PHYSICAL SECTOR ADDRESS=19 |
| MANAGEMENT PHYSICAL SECTOR NUMBER=0 |
| DEFECT LIST 1<br>   DEFECT START ADDRESS=0<br>   CONTINUOUS DEFECTIVE SECTOR NUMBER=0 |
| DEFECT LIST 2<br>   DEFECT START ADDRESS=0<br>   CONTINUOUS DEFECTIVE SECTOR NUMBER=0 |
| DEFECT LIST 3<br>   DEFECT START ADDRESS=0<br>   CONTINUOUS DEFECTIVE SECTOR NUMBER=0 |
| USER DIRECTORY DATA 32 BYTE |

METHOD OF RECORDING DATA AND INFORMATION REGARDING DEFECTS

This application is a continuation of prior application, Ser. No. 07/942,403 filed Sep. 9, 1992, now abandoned.

BACKGROUND OF THE INVENTION

1. Field of the Invention

The invention relates to a method of recording data and information regarding defects of an information recording medium onto such a medium.

2. Related Background Art

Hitherto, an optical disk or an optical card to optically record information is known as a WORM type information recording medium. In the case of recording or reproducing data onto/from such a recording medium, the data is generally managed for every file. Auxiliary data, namely, what is called a directory is used to manage the file data. The directory information ordinarily includes file information such as a file name, file length, head track, and the like and is written into a part of the recording medium. However, in the case when a defect occurs in a part of the recording medium and an area in which the data cannot be recorded or reproduced occurs, an alternating process to again record the same information into an area (hereinafter, referred to as an alternating area) in place of the defective area is executed in order to relieve the information in such a defective area. A method of executing such an alternating process has been proposed in JP-A-61-243994. The alternating processing method will now be described hereinbelow with reference to FIG. 1. In FIG. 1, an optical card 1 is shown as a WORM type information recording medium. A recording area of the optical card 1 is divided into a data recording area 2 and a directory area 3. Tracks $T_1$ to $T_4$ are typically shown in the data recording area 2. It is now assumed that a series of information as much as three tracks is recorded as one file and the file name is set to A. A directory $D_1$ in the directory area 3 relates to directory information to manage the file data recorded on the tracks $T_1$ to $T_4$ and comprises a file name 5-1, a data recording start track number 5-2, a total track number 5-3, and a recording error track number 5-4. Reference numeral 4 denotes a track number of each track.

In the case of recording information of the file A onto the optical card 1, the information is first recorded to the head track $T_1$. Just after the recording of the information, the recorded information on the track $T_1$ is read out and verified. As a result of the verification, when a point that the information has normally been recorded can be confirmed, information is recorded onto the next track $T_2$. In a manner similar to the above, a series of file data is sequentially recorded onto the tracks $T_3$ and $T_4$. If a verification error occurred in the track $T_3$, the number of the track in which the error has occurred is recorded into a memory. The number of a track number memory in which the track number of the data has been accumulated is rewritten from the 3-track to the 4-track. Subsequently, the data to be recorded to the track $T_3$ is again recorded to the track $T_4$. When no error is detected as a result of the verification, it is determined that all of the data of the file A could be recorded, so that the directory information such as file name A, data recording start track number, and the like mentioned above is recorded into the directory $D_1$. Just after the recording of the directory $D_1$, the directory information is also obviously verified. Upon reproduction of the data, the directory information is read out before the data is read out. If there is a track having an error, such a track is skipped and the data of the track on the alternating side is read out.

However, according to the conventional information recording method, when a number of tracks having recording errors exist in one file, there is a case where in all of the error track numbers cannot be recorded in one directory, so that there is a problem such that an obstacle occurs in the management of the file data.

Upon execution of the alternating process as mentioned above, when a defect also exists in the alternating area, the alternating process is retried while avoiding the defect in the alternating area. The number of retry times has been predetermined for the recording apparatus. When the alternating process is finished within the number of retry times, the alternating management information is recorded. When the alternating process is not finished within the number of retry times, the alternating management information is not recorded.

Therefore, in the conventional method, in the case when the recording medium is taken out from the recording apparatus in a state in which the alternating process is not finished within the number of retry times and the alternating management information is not recorded as well and, thereafter, the recording medium is again loaded into the recording apparatus, if the operator intends to record information, so long as there are defects upon recording and the alternating process is executed, there are the following drawbacks.

(1) Since the defect position of the alternating area is not recorded in the alternating management information, the alternating process is performed at the position where the error has once occurred, and an error again occurs, so that the access time becomes slow. In the worst case, in the retries of all of the alternating processes, the alternating process is performed at the defect position and is not finished within the number of retry times.

(2) If the recording apparatus searches a defect in the alternating area in order to avoid the problem of the above item (1), it takes a long time.

SUMMARY OF THE INVENTION

It is an object of the invention to solve the problems of the conventional techniques mentioned above and to provide an information recording method which can manage data without any trouble even when a number of defects exist on a medium.

According to the first embodiment of the invention, there is provided a method of recording information onto an information recording medium comprising a first area having a plurality of sectors to record data and a second area having a plurality of blocks to record directories which are used to manage the data, wherein the method comprises the steps of: recording the data into a first sector group consisting of at least one sector in the first area of the medium; when there is a defect in at least a part of the first sector group, recording the data to be recorded to such a portion into a second sector group consisting of at least one sector of the first area; recording a directory corresponding to the data into the first block of the second area of the medium; when there is a defect in the first sector group, recording information regarding such a defect into the first block of the second area; and when only a part of the information regarding the defect can be recorded into the first block, recording the remaining information regarding the defect into the second block of the second area.

According to the second embodiment of the invention, there is provided a method of recording information onto an information recording medium comprising a first area having a plurality of blocks to record data and a second area to record information to manage the data, wherein the method comprises the steps of: (a) recording the data into one of a plurality of blocks of the first area of the medium; (b) when there is a defect in one of the blocks, recording the data to be recorded into such one block into another block of the first area; (c) when there is a defect in such other block, recording the data to be recorded to such other block into a further other block; (d) repeating the processes in the above steps (a) to (c) until the recording of the data is finished; and (e) when the process in the step (c) is continuously executed a predetermined number of times, stopping the recording and recording information regarding the defect into the second area.

According to the third embodiment of the invention, there is provided a method of recording information onto an information recording medium comprising a first area having a plurality of blocks to record data, a second area having a plurality of blocks to record data, and a third area to record information to manage the data, wherein the method comprises the steps of: (a) recording data into one of the plurality of blocks of the first area of the medium; (b) when there is a defect in one of the blocks of the first area, recording the data to be recorded to such one block into one of the plurality of blocks of the second area; (c) when there is defect in one of the blocks of the second area, recording the data to be recorded to such one block into another block of the second area; (d) repeating the processes in the above steps (a) to (c) until the recording of the data is finished; and (e) when the process in the above item (c) is continuously executed a predetermined number of times, stopping the recording and recording the information regarding the defect into the third area.

BRIEF DESCRIPTION OF THE DRAWINGS

FIGS. 4A and 4B are schematic diagrams showing constructions of a user directory and a system directory in the first embodiment, respectively;

FIG. 5 is a flowchart for explaining an example of a processing procedure to record data according to the first embodiment;

FIG. 6 is a flowchart for explaining an example of a processing procedure to record the directory according to the first embodiment;

FIGS. 7A to 7C are schematic diagrams showing practical examples of the directories recorded in the example of FIG. 6;

FIGS. 9A to 9C are schematic diagrams showing practical examples of the directory recorded in the example of FIG. 8;

DETAILED DESCRIPTION OF THE PREFERRED EMBODIMENTS

Figure 1:
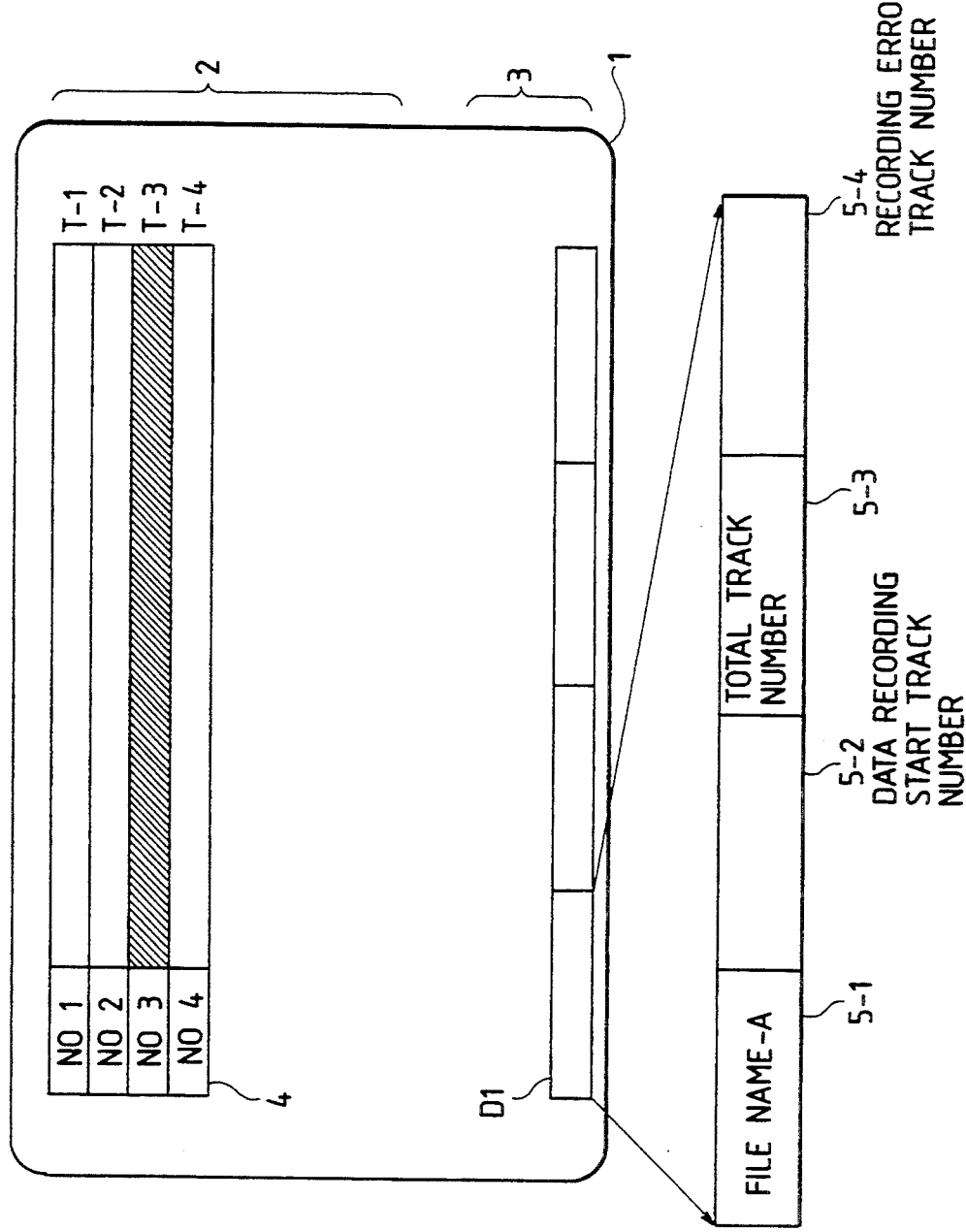
FIG. 1 is a schematic diagram of an optical card for explaining a conventional information recording method.
Figure 2:
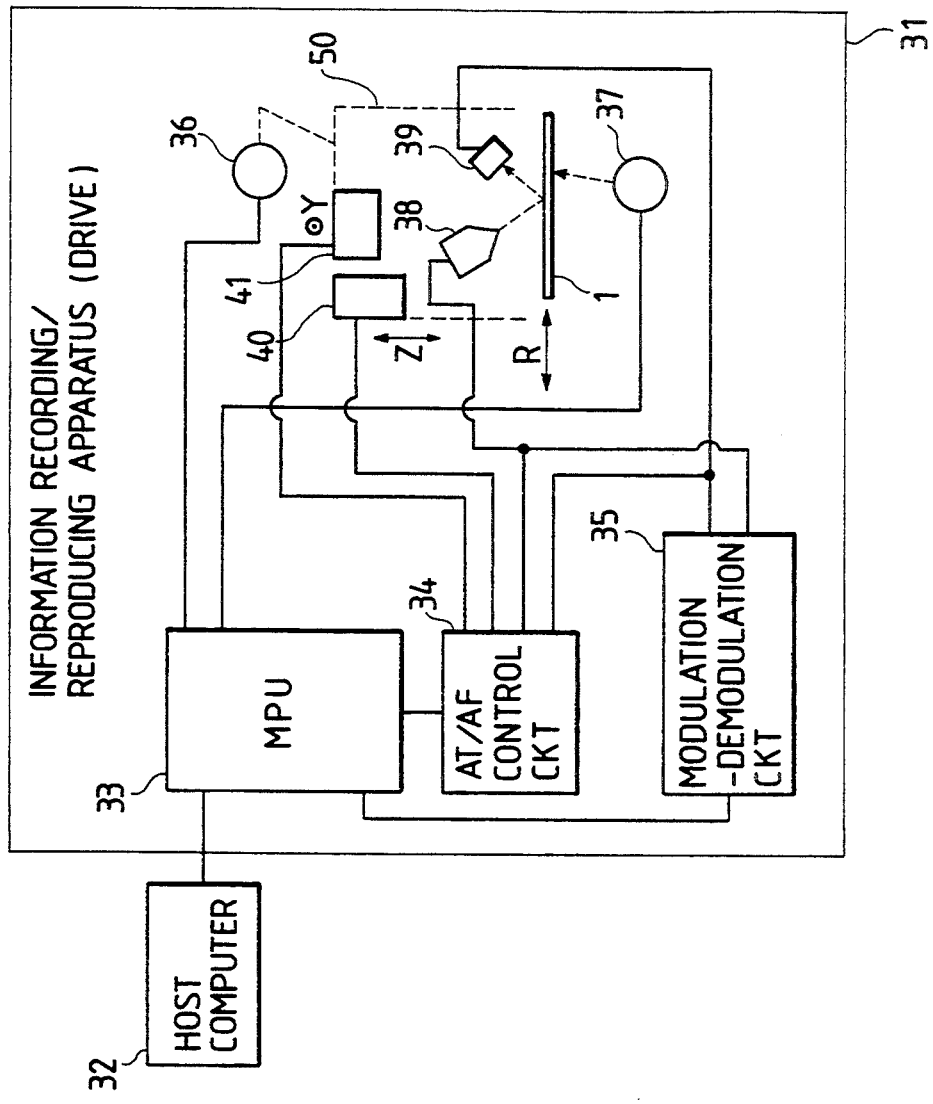
FIG. 2 is a schematic diagram showing an example of an information recording and reproducing apparatus for executing an information recording method of the invention.

Embodiments of the invention will be described in detail hereinbelow with reference to the drawings. In the following description, it is assumed that a WORM (Write Once Read Mostly) type optical card is used as an example of an information recording medium. First, an example of a construction of an information recording and reproducing apparatus according to the invention will be described with reference to FIG. 2. In FIG. 2, reference numeral 31 denotes an information recording and reproducing apparatus (hereinafter, referred to as a drive). A host computer 32 as a high-order control unit is connected to the drive 31. Reference numeral 37 denotes a card feed motor for inserting the optical card 1 into the drive through a conveying mechanism (not shown), for reciprocating the optical card in R directions by a predetermined drive, and further for ejecting the card out of the apparatus. Reference numeral 38 denotes an optical beam irradiating optical system including a light source. A light beam spot is formed onto the optical card 1 by the optical system 38 in the recording or reproducing mode of information. Reference numeral 39 denotes a photodetector to receive the reflected light of the light beam spot on the optical card 1; 40 an AF actuator for driving a part of the light beam irradiating optical system 38 and moving a focusing position of the light beam spot on the optical card surface in Z directions, namely, in the directions perpendicular to the surface of the optical card, thereby performing an automatic focusing (AF); and 41 an AT actuator for driving a part of the optical system 38 and moving the optical beam spot on the optical card surface in Y directions (namely, directions perpendicular to both of the R and Z directions), thereby performing an automatic tracking (AT).

An optical head 50 is constructed by including the light beam irradiating optical system 38, photo-detector 39, AF actuator 40, and AT actuator 41. Reference numeral 36 denotes a head feed motor for moving the optical head in the Y directions, thereby allowing the light beam spot to be accessed to a desired track on the optical card. A micro processing unit (MPU) 33 has therein a read only memory (ROM) and a random access memory (RAM) and controls the card feed motor 37 and head feed motor 36. The MPU 33 also executes a communication of data with the host computer 32, a control, and the like under the control of the host computer 32. An AT/AF control circuit 34 receives the signal from the photodetector 39 and drives the AF actuator 40 and AT actuator 41. The output signal of the photodetector 39 is supplied to the AT/AF control circuit 34. On the basis of the output signal of the photodetector, the control circuit 34 controls the AF actuator 40 and AT actuator 41 and executes the AF and AT operations. The output signal of the photodetector 39 is also supplied to a modulation/ demodulation circuit 35, by which the read information is demodulated and the demodulation signal is sent to the MPU 33. The modulation/demodulation circuit 35 modulates the information signal which is transmitted from the MPU 33 and drives the light beam irradiating optical system 38 in accordance with the modulation signal and executes the information recording. In the reproducing mode, the circuit 35 demodulates the data on the basis of the signal from the photodetector 39. The host computer 32 transmits and receives the data to/from the drive 31 and executes the recording and reproducing operations of the information for the optical card 1 every data track. Generally, an error ratio of the optical card 1 is high in terms of the nature of the medium, so that error correcting means is necessary in the case when information of a high reliability is required.

Figure 3:
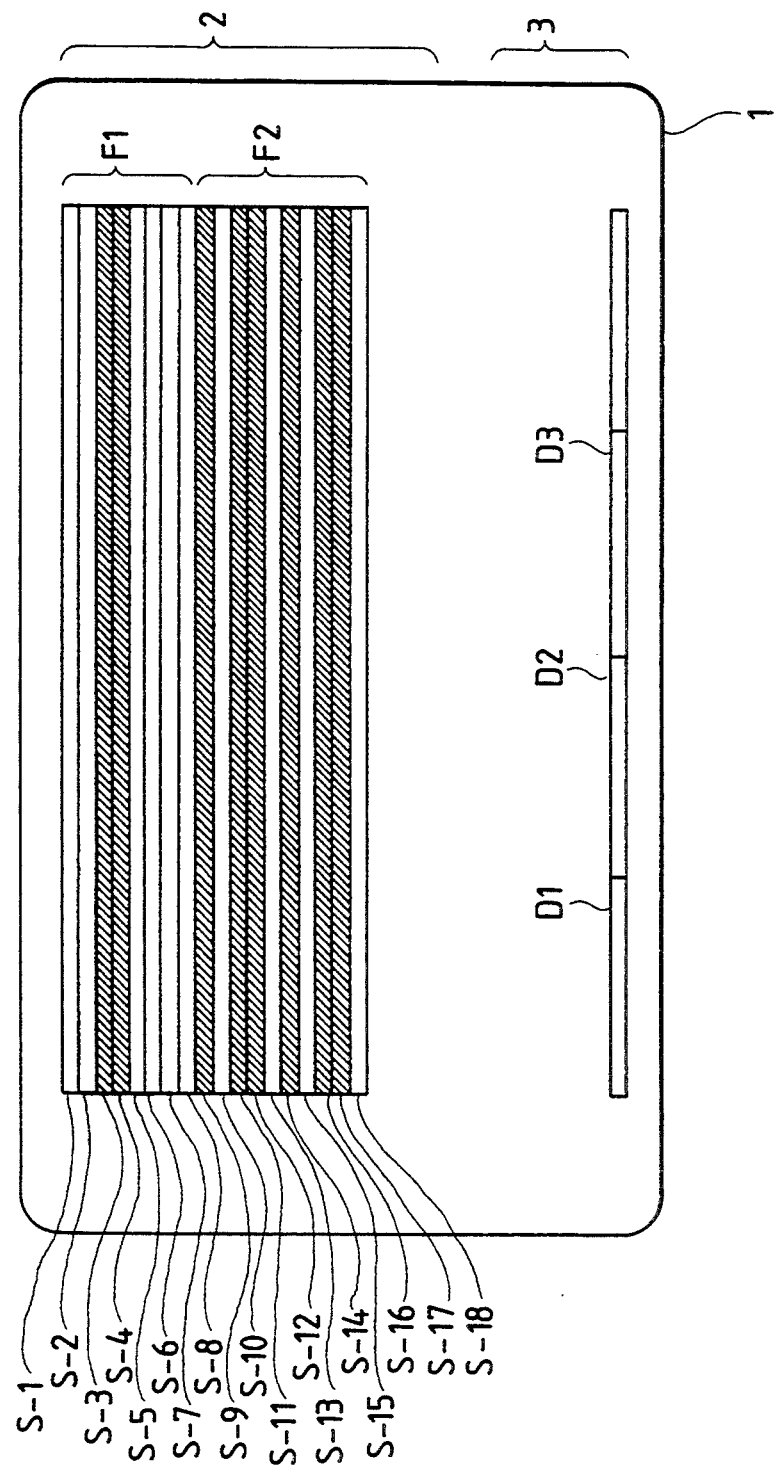
FIG. 3 is a schematic diagram of an optical card for explaining the first embodiment of the invention.

The first embodiment of an information recording method of the invention will now be described. FIG. 3 is a diagram showing the recording surface of the optical card which is used in the formation recording method of the embodiment. Reference numeral 1 denotes the optical card; 2 the data area; 3 the directory area; S-1 to S-18 sectors in which the hatched sector indicates the sector which is determined to have an error as a result of the verification after the recording; $F_1$ and $F_2$ files each of which is constructed by a plurality of sectors; and $D_1$ to $D_3$ directories. Further, an address indicative of the sector position of the data area which has been divided into a plurality of sectors is called a physical address for convenience of explanation. In FIG. 3, S-1, S-2, and S-3 denote addresses 1, 2, and 3 of the physical addresses. On the other hand, only the sectors which could normally be recorded as a result of the verification after the recording are called logical addresses for convenience of explanation. It is now assumed that the logical addresses are sequentially counted in accordance with the order from the head. In FIG. 3, the logical address for S-1 assumes "1", the logical address for S-2 assumes "2", and the logical address for S-3 assumes "3". In a manner similar to the above, the logical addresses are determined.

FIG. 4A shows a format of the user directory in the embodiment. FIG. 4B shows a format of the system directory. Those directory formats will now be described hereinbelow. A header is used to discriminate whether the directory is the user directory or the system directory. An ASCII code of DIRU or DIRS is written as a header. A system directory number is a serial number which is common to both the system directory and the user directory. A user directory number is a serial number which is applied to only the user directory. A start logical sector address and the management logical sector number indicate the head logical address of the logical area which is managed by the directory and the size of the area. A start physical sector address and a management physical sector number indicate the head physical address of the physical area which is managed by the directory and the size of the area. A defect list is provided to express defect information which is constructed by the defect start address as a head physical address of the defective sector and the continuous defective sector number. The above recording method is very effective because it is sufficient to use a small number of bytes for a burst defect. Three defect lists 1 to 3 can be recorded in the user directory. Eleven defect lists 1 to 11 can be recorded into the system directory. The user directory data is recorded in only the user directory and is constructed by information such as file name, file size, and the like.

FIG. 5 is a flowchart showing a flow of recording processes of file data according to the information recording method of the embodiment. For instance, it is now assumed that the data of the file $F_2$ having a capacity of four sectors shown in FIG. 3 is recorded. In FIG. 5, it is assumed that a recording request has been generated from the host computer 32 to the drive 31 and the data of the file $F_2$ has been transmitted. The data is sent to the MPU 33 of the drive 31. Prior to recording the data, the MPU 33 stores the physical address and logical address to start the recording into an internal memory (steps S1 and S2). In the example, the physical address is set to 9 and the logical address is set to 7 as will be obviously understood from FIG. 3. The MPU 33 subsequently controls each of the above sections and records the data into the sector of the address 9 (S-9) as a target physical address and reproduces and verifies the recording data just after the recording (S3). After completion of the verification, the MPU 33 discriminates whether the data could normally be recorded or not (S4). In this instance, since the address 9 of the physical address indicates the defective sector as shown in FIG. 3, a verification error is obviously detected. Therefore, when the verification error is detected, the MPU 33 stores the address of the erroneous defective sector into the memory (S5). After that, the target physical address is increased by "1" (S6). After that, the processing routine is returned to step S3. In step S3, the data is again recorded into address 10 as the next physical address and the data is verified. In this case, as shown in FIG. 3, since the address 10 as a physical address indicates a normal sector, no verification error is detected. The MPU 33 assigns the logical address to the normally Written sectors and increases the logical address by "1" for the next data recording (S7). The MPU 33 increases the physical address by "1" for the next data recording (S8). The MPU 33 checks to see if all of the data of the file $F_2$ requested could be recorded or not (S9). If NO, the processing routine is again returned to step S3 and the similar processes are repeated. After confirming that all of the data of the file $F_2$ had been recorded, an end of recording is notified to the host computer 32 and the recording process is finished.

FIG. 6 is a flowchart showing a recording method of the directory according to the information recording method of the embodiment. The recording of the directory of FIG. 6 is executed after all of the data of the file $F_2$ was recorded in accordance with the flowchart of FIG. 5. FIGS. 7A to 7C are diagrams showing the contents of the directories when the directories are recorded in accordance with FIG. 6. The recording method of the directory will now be described hereinbelow with reference to FIGS. 2, 3, 6, and 7A to 7C. First, in FIG. 6, the MPU 33 forms a defect list and sector management information on the basis of the defective sector addresses, start recording physical address, end recording physical address, start recording logical address, and end recording logical address which have been stored in the memory (S1). The information such as defective sector addresses and the like stored in the memory is the information stored upon recording of the information as described in FIG. 5. The defect list is formed prior to recording the user directory and up to three defect lists are formed. FIG. 7B shows the defect lists and sector management information formed in this instance. In FIG. 7B, for instance, the start logic sector address is set to "7" and the start physical sector address is set to "9". In the defect list 1, the defect start address is set to "9" and the continuous defective sector number is set to "1". In the defect list 2, the defect start address is set to "11" and the continuous defect sector is set to "2". In the defect list 3, the defect start address is set to "2" and the continuous defect sector number is set to "1". In the embodiment, the defect lists can be recorded up to three in the user directory. Therefore, in FIG. 3, since three defect lists are prepared for the sectors S-9, S-11 and S-12, and S-14 which are defective sectors indicated with hatching, the defect list of the defect start address 16 is not prepared.

As mentioned above, the MPU 33 records the user directory comprising the defect lists and sector management information shown in FIG. 7B onto the optical card 1 (S2). When all of the defect information and sector management information for the file $F_2$ can be recorded into the user directory, the recording process of the directory is finished. That is, a check is made to see if any other defect list still remains or not (S3). When no defect list remains, the processing routine is finished. In the embodiment, since the defect list which is not recorded remains as mentioned above, a defect list of the unrecorded portions and sector management information are formed (S4) and a system directory is recorded on the basis of them (S5). The MPU 33 repeats the processes in steps S3 to S5 until no defect information remains in the file F2. After all of the above information was recorded, the processing routine is finished. FIG. 7C shows the system directory recorded as mentioned above. It will be understood that the defect list and sector management information regarding the remaining defective sector address 16 have been recorded. In the embodiment, since the number of remaining defective sectors is equal to one, only the defect list 1 (defect start address 16 and continuous defective sector number 1) regarding the remaining defective sector is recorded as shown in FIG. 7C. However, as mentioned above, up to eleven defect lists can be recorded into the system directory. FIG. 7A is a diagram showing the content of the system directory when the data of the file $F_1$ shown in FIG. 3 has been recorded. Since two defective sectors exist in the file $F_1$ and are continuous, only the defect list 1 (defect start address 3 and continuous defective sector number 2) is recorded as shown in FIG. 7A. Accordingly, since the number of defect lists is within three, only the user directory is recorded and the system directory is not recorded.

Figure 8:
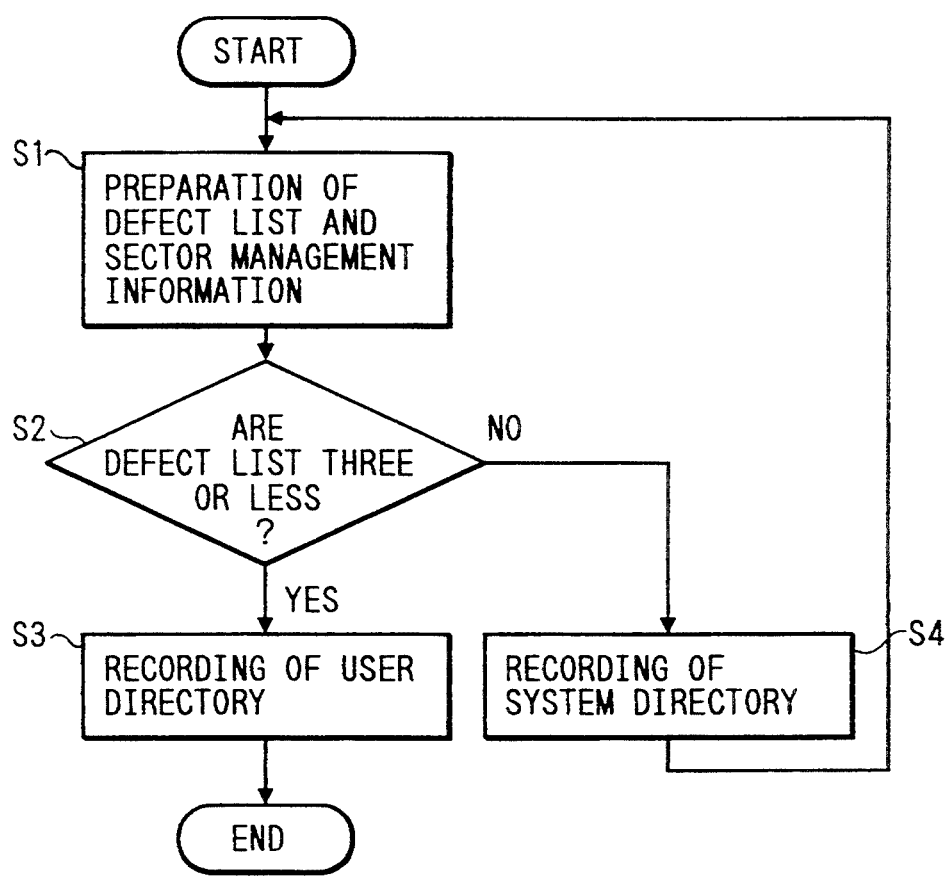
FIG. 8 is a flowchart for explaining another example of a processing procedure to record the directory in the first embodiment.

A modification of the directory recording method of the embodiment will now be described. FIG. 8 is a flowchart showing a recording method of the directory according to the embodiment. FIGS. 9A to 9C are diagrams showing the contents of the directories recorded in accordance with the flowchart of FIG. 8. In the modification, the recording method of the directory in the case when the file $F_2$ shown in FIG. 3 has been recorded in a manner similar to the above embodiment will be described. In FIG. 8, the MPU 33 first forms defect lists and sector management information from the defect information, start recording physical address, end recording physical address, start recording logical address, and end recording logical address which have been recorded in the memory (S1). The maximum number of defect lists in this instance is set to 11. The MPU 33 discriminates whether the number of defect lists formed is equal to or less than 3 or not (S2). When it is equal to or less than 3, only the user directory is recorded and the processing routine is finished. In the modification, since there are defective sectors of four defect lists in the file $F_2$, as shown in FIG. 9C, no defect list is recorded in the user directory. The processing routine advances to step S4 and the system directory is recorded. FIG. 9B shows the content of the system directory recorded in this instance. It will be understood that the defect lists 1 to 4 have been recorded on the basis of the defective sector information in the file $F_2$. Although the recording method is different, the content of FIG. 9B is consequently substantially the same as the contents of FIGS. 7B and 7C in the above embodiment. In case of recording the file $F_1$, the content of the directory is as shown in FIG. 9A. In this case, since the number of defect lists to be recorded in the file $F_1$ is equal to one, the user directory is recorded in step S3 in FIG. 8. The content of the user directory of FIG. 9A is substantially the same as the content of the user directory shown in FIG. 7A. In the modification, since the number of processes of the MPU 33 is smaller than that in the above embodiment, the burden of the MPU 33 can be reduced because of the reduced number of processes.

The second embodiment of the invention in which defect information is recorded into a plurality of concatenated blocks of the directory area will now be described hereinbelow. The method of the second embodiment is also executed by, for instance, the information recording and reproducing apparatus shown in FIG. 2.

Figure 10:
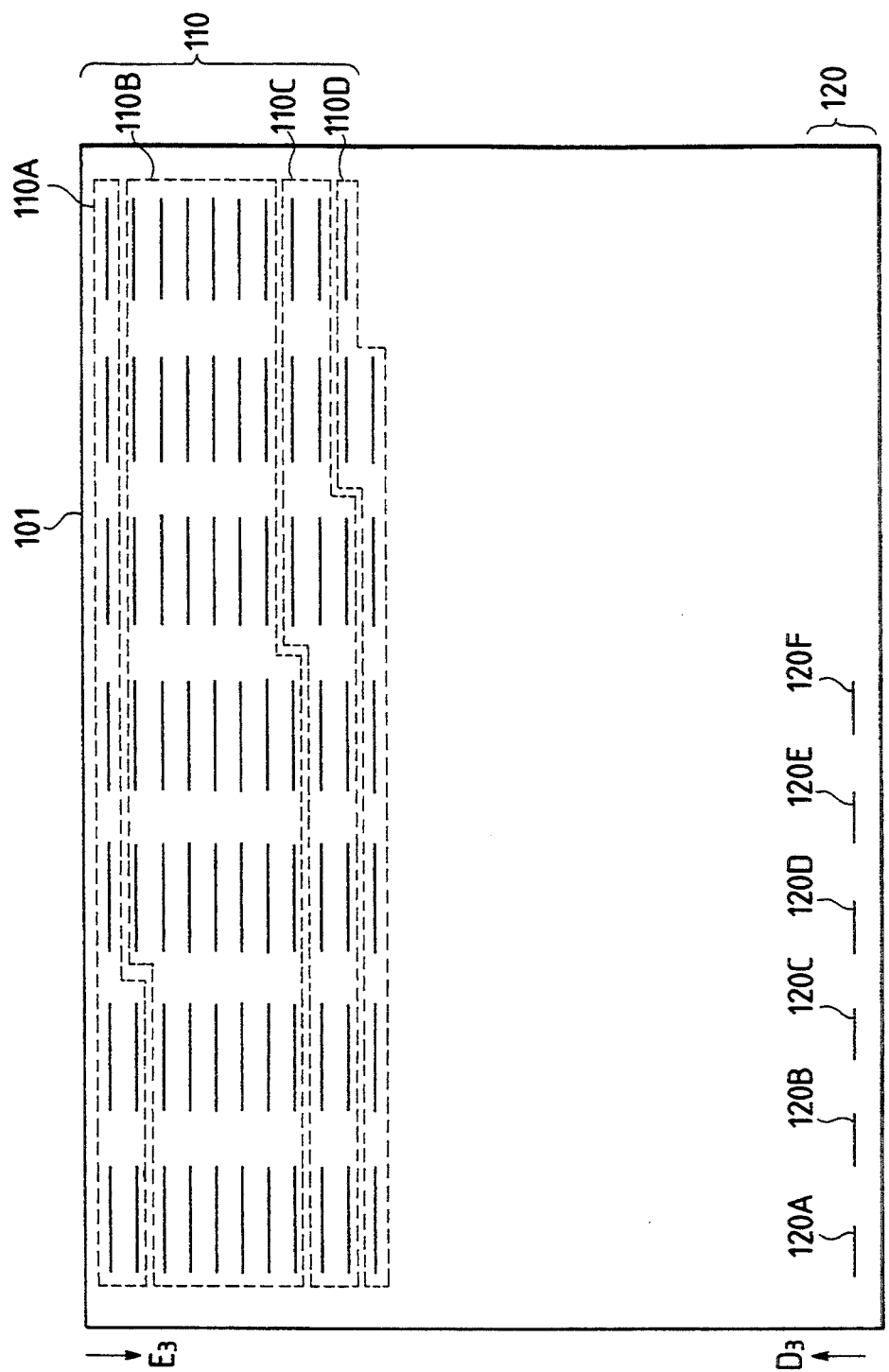
FIG. 10 is a schematic diagram of an optical card for explaining the second embodiment of the invention.

An embodiment of the information recording method of the invention will now be described. FIG. 10 is a schematic plan view of a block in the optical card recorded by the method of the second embodiment of the invention. An optical card 101 has a data portion 110 (110A, 110B, 110C, 110D) comprising data files and a directory portion 120 (120A, 120B, ..., 120F) comprising directory blocks. Data is recorded in the data portion 110 of the optical card 101 in the direction indicated by an arrow $E_3$. Directories are recorded in the directory portion 120 in the direction indicated by an arrow $D_3$. When there is a defective sector during the recording, the alternating process to the next sector is executed. The defective sector address in the alternating process is stored into the RAM in the MPU 33 shown in FIG. 2. Data is similarly recorded. After all of the data was completely written, the directory information and the defective sector address information stored in the RAM in the MPU 33 are recorded onto the optical card 101.

Figure 11:
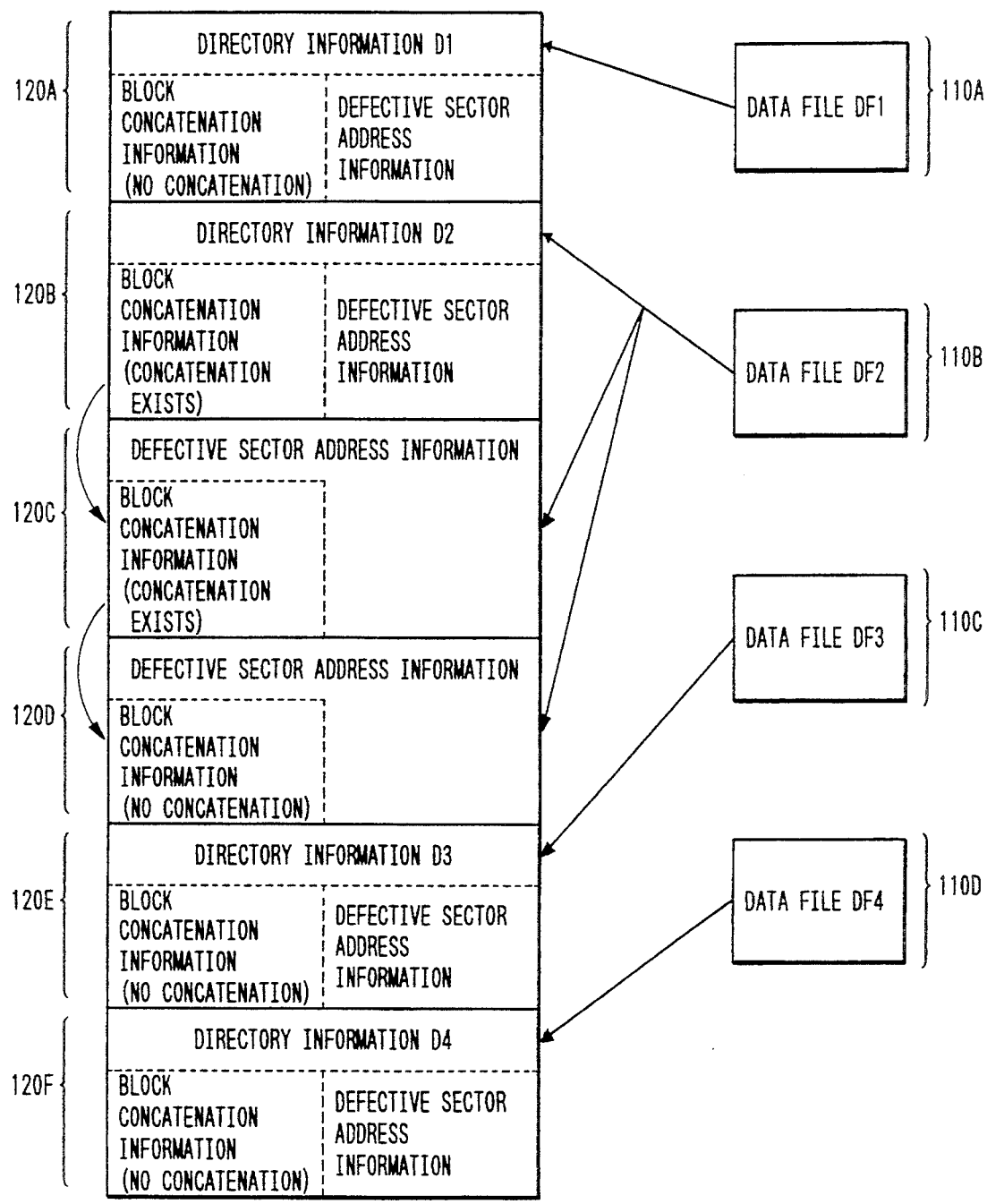
FIG. 11 is a schematic diagram showing the relation between the data and directories which are recorded in the second embodiment.

FIG. 11 is a diagram showing the relation between the data files and the directory information in the optical card 101 in FIG. 10. The directory information and defective sector address information for each data file and the concatenation information of the directory blocks have been recorded in the directory block. The directory 120A corresponds to the data file 110A. The directories 120B, 120C, and 120D correspond to the data file 110B. The directory 120E corresponds to the data file 110C. The directory 120F corresponds to the data file 110D. In the data files 110A, 110B, and 110C, since the number of defective sectors is small, an amount of defective sector address information is also small. Therefore, since it is sufficient to use one directory block for the data file, a fact that there is no concatenation is recorded in the block concatenation information. In this case, since the number of defective sectors in the data file 110B is large, the defective sector address information cannot be recorded unless three directory information blocks are used. Therefore, the information indicative of the concatenation with the directory 120C has been recorded in the directory block 120B. The information indicative of the concatenation with the directory 120D has been recorded in the directory block 120C. In this manner, a plurality of directory blocks are concatenated and a large amount of defective sector address information has been recorded.

The third embodiment of the invention which copes with the case where there is a defect in the block to again record the data will now be described hereinbelow. The method of the third embodiment is also executed by, for instance, the information recording and reproducing apparatus as shown in FIG. 2.

Figure 12:
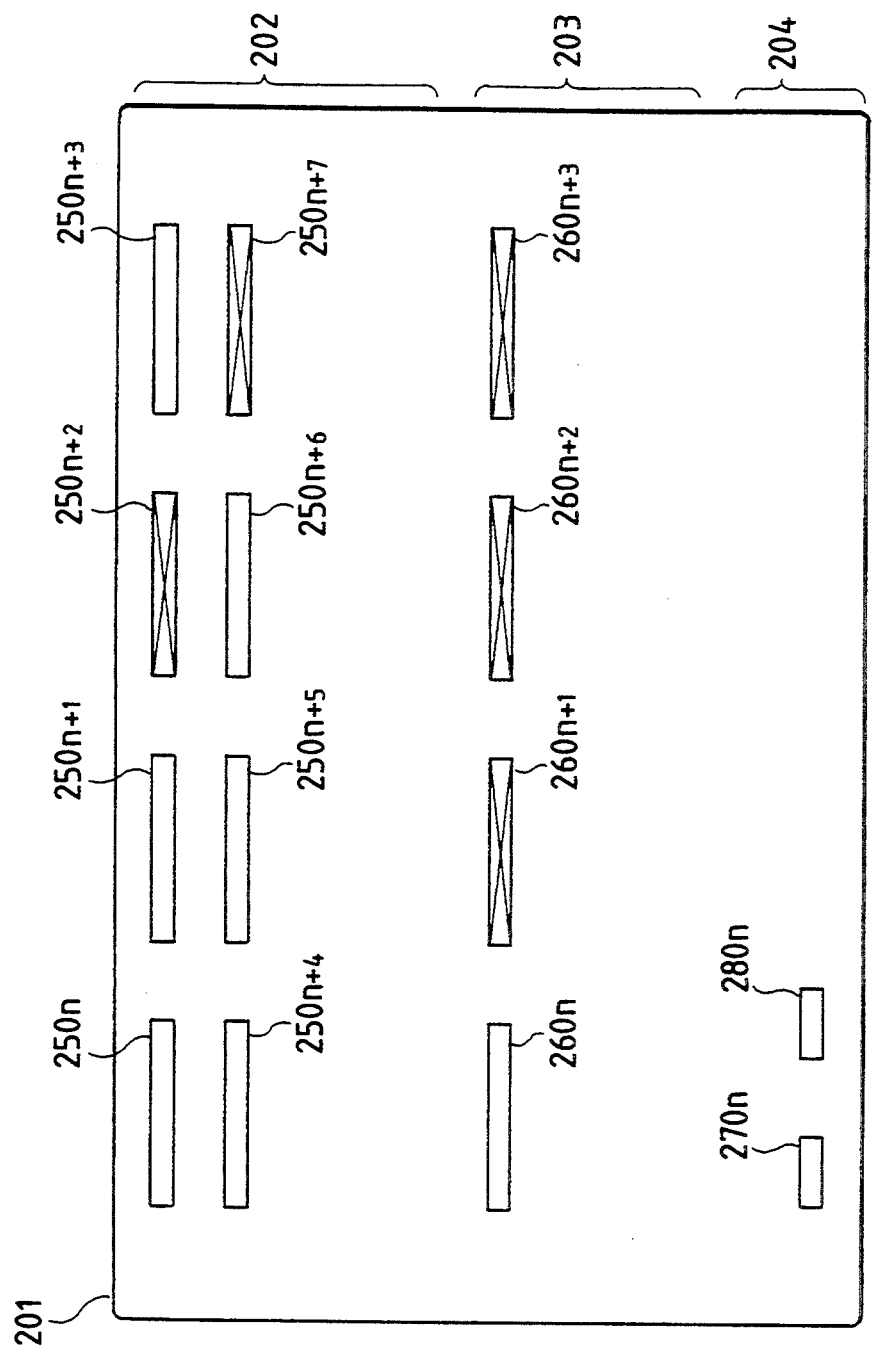
FIG. 12 is a schematic diagram of an optical card for explaining the third embodiment of the invention.

FIG. 12 is a diagram schematically showing all of the recording areas of an optical card 201 according to the third embodiment. In FIG. 12, reference numeral 202 denotes a data recording area to record information; 203 an alternating area to be alternated when a defect occurs in the data recording area 202; and 204 an alternating management area to record alternating management information regarding the alternation or to record defect position information in the case when the alternating process is not completed within the number of retry times as will be explained hereinafter. The data recording area 202 is constructed by a plurality of recording blocks. In FIG. 12, eight recording blocks $250_n$ to $250_{n+7}$ are shown. The recording blocks $250_{n+2}$ and $250_{n+7}$ among them assume defective blocks. The alternating area 203 is also constructed by a plurality of alternating blocks $260_n$ to $260_{n+3}$. The alternating blocks $260_{n+1}$ to $260_{n+3}$ among them assume defective blocks. Further, the alternating management area 204 is constructed by alternating management information blocks $270_n$ and $280_n$. In the embodiment, it is determined that the number of retry times of the alternating process is set to two.

It is now assumed that data is transferred from the host computer 32 in FIG. 2 to the drive 31 and the data is recorded onto the optical card 201 as shown in FIG. 12. It is assumed that the data is sequentially recorded into the recording blocks $250_n$ to $250_{n+7}$ every recording block. In the drive 31 in FIG. 2, the data is first sequentially recorded into the recording blocks $250_n$ and $250_{n+1}$ and the recording of the data into the recording block $250_{n+2}$ is subsequently started. However, since the recording block $250_{n+2}$ is the defective block as mentioned above, an error occurs and the drive 31 executes the alternating process to the alternating block. In this case, the data in the recording block $250_{n+2}$ is recorded into the alternating block $260_n$. Both the address on the alternation original side upon alternation and the address on the alternation side are recorded into the alternating management information block $270_n$. After completion of the alternating process, the drive 31 subsequently executes the recording operation and sequentially records the data into the recording blocks $250_{n+3}$ to $250_{n+6}$. However, since the next recording block $250_{n+7}$ is the defective block, an error again occurs and the drive 31 again starts the alternating process. In the alternating process, the drive 31 first intends to record the data into the alternating block $260_{n+1}$. However, since the alternating block $260_{n+1}$ is the defective block, an error occurs. Therefore, the drive executes thee alternating process to the next alternating block $260_{n+2}$. However, since the alternating block $260_{n+2}$ is also the defective block, an error also occurs. In the alternating process to the next alternating block $260_{n+3}$, further, an error also occurs since the alternating block $260_{n+3}$ is the defective block. Consequently, in the alternating process to the recording block $250_{n+7}$, the error occurs three times including two retry times. Therefore, according to the embodiment, since the number of retry times has been set to two as mentioned above, the information indicating that the alternating blocks $260_{n+1}$ to $260_{n+3}$ are the defective blocks is recorded into the alternating management information block $280_n$. As mentioned above, when the defect information of the alternating blocks is recorded into a predetermined area of the optical card 201, for instance, in the case when the optical card 201 is taken out from the drive 31 and is again loaded into the drive 31, the drive 31 immediately reads out the information from the alternating management information region 204 and can recognize the space area of the alternating area of the loaded optical card 201 from the information of the block $270_n$ as alternating management information and the information of the block $280_n$ as defective block information. Therefore, the alternating process in the next recording can be rapidly executed without performing the vain retry.

Figure 13:
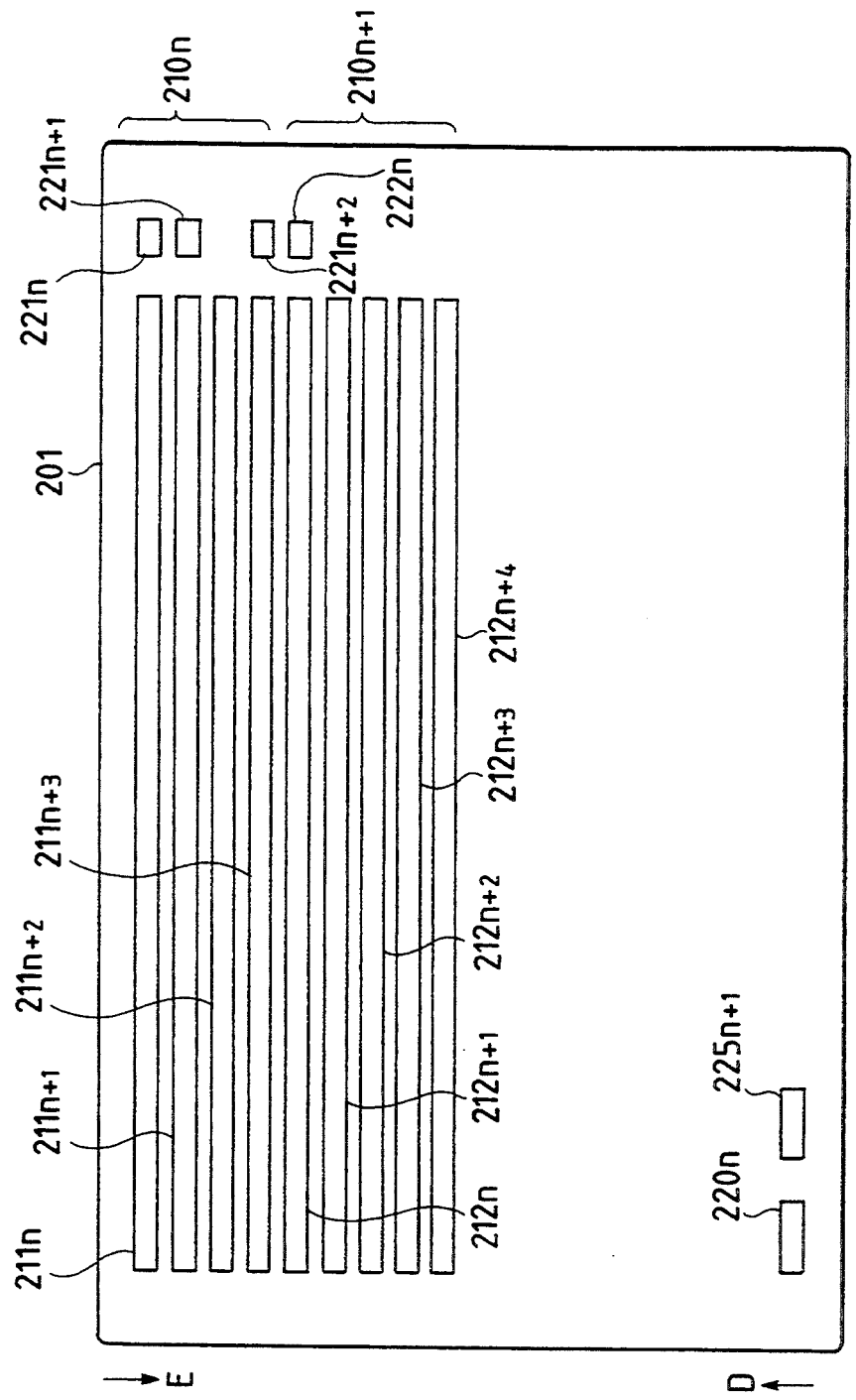
FIG. 13 is a schematic diagram of an optical card for explaining the fourth embodiment of the invention.

The fourth embodiment of the invention will now be described. FIG. 13 is a plan view schematically showing recording areas of the optical card. Reference numerals $211_n$ to $211_{n+3}$ and $212_n$ to $212_{n+4}$ denote tracks as a recording minimum unit of data. Reference numerals $221_n$, $221_{n+1}$, and $222_n$ indicate verification marks which are recorded when the data can be normally recorded onto the corresponding tracks. It is now assumed that the tracks $211_{n+2}$ and $212_{n+1}$ to $212_{n+4}$ are the defective tracks. Reference numeral $210_n$ denotes a file data comprising all of the data of the tracks $211_n$ to $211_{n+3}$; $210_{n+1}$ similarly indicates file data comprising all of the data of the tracks $212_n$ to $212_{n+4}$; $220_n$ auxiliary data (what is called a directory) to manage the file data $210_n$; and $225_{n+1}$ a defect information recording area to record the information of the defective tracks as will be explained hereinafter. In the embodiment, it is assumed that the file data is recorded in the direction of an arrow E and the directory is recorded in the direction of an arrow D. The file data of a large capacity is divided into tracks as a recording minimum unit. When the tracks can be normally recorded, the verification marks are recorded. After all of the file data were completely recorded, the directory is recorded. The start track position and end track position of the file data, the file name, and the like are recorded into the directory. When a recording error occurs due to a defect, the alternating area is arranged near the error occurring position and the alternating process is executed. The track which exists at the nearest position in the E direction from the track position without a verification mark and on which the verification mark has been recorded is used as an alternating area. In the embodiment, the number of retry times of the alternating process is also set to two.

It is now assumed that the data is transferred from the host computer 32 in FIG. 2 to the drive 31 and the data is recorded onto the optical card 201 as shown in FIG. 13. In this case, the file data of $210_n$ and $210_{n+1}$ are transferred and the data is recorded onto the tracks. First, the recording of the file data $210_n$ corresponding to the capacity of three tracks is started and the data is first recorded to the head track $211_n$. In this instance, since the track $211_n$ is not a defective track, the data is normally recorded. After completion of the recording, the verification mark $221_n$ is recorded. Subsequently, the data is recorded onto the track $211_{n+1}$ and the verification mark $221_{n+1}$ is recorded since the track $211_{n+1}$ is not a defective track as well. However, since the next track $211_{n+2}$ is a defective track, the drive 31 doesn't record the verification mark and executes the alternating process to record the data onto the next track $211_{n+3}$. Since the alternating track $211_{n+3}$ is not a defective track, the data is normally recorded and the verification mark $221_{n+2}$ is recorded. Since all of the file data $210_n$ can be recorded as mentioned above, the directory $220_n$ is recorded.

After that, the recording of the file data $210_{n+1}$ corresponding to the capacity of two tracks is started and the data is first recorded to the track $212_n$. Since the track $212_n$ is not a defective track, the data is normally recorded and the verification mark $222_n$ is recorded. Although the drive subsequently intends to record the data onto the track $212_{n+1}$, since the track $212_{n+1}$ is a defective track as mentioned above, the alternating process is executed to the next track $212_{n+2}$. However, since the track $212_{n+2}$ is also a defective track, the retry is executed. The retry is performed two times for the tracks $212_{n+3}$ and $212_{n+4}$. However, all of those tracks are defective tracks. Since the number of retry times has been set to two in the embodiment, however, the recording of the file data is stopped and the directory is not recorded and the information indicating that the tracks $212_{n+1}$ to $212_{n+4}$ are the defective tracks is recorded to $225_{n+1}$. By recording the defective track information into a predetermined area of the optical card as mentioned above, in the case when the optical card is once taken out from the drive 31 and is again loaded into drive 31, by reading out the directory $220_n$ and information from the area $225_{n+1}$ in which the defective track information has been recorded, the recording start position of the file data can be known.

The present invention is not limited to the foregoing embodiments but many modifications and variations are possible. For instance, in addition to the optical card, a disk-shaped or tape-shaped recording medium also can be used as an information recording medium. The invention incorporates all of such application examples without departing from the spirit and scope of the appended claims of the invention.

What is claimed is:

1. A method of recording information onto an information recording medium comprising a data area having a plurality of sectors to record data and a directory area having a plurality of blocks to record directories, which are used to manage the data, said method comprising the steps of:

recording the data into a first sector group comprising at least one sector in the data area of the medium;

when there is a defect in at least a portion of the first sector group, recording the data to be recorded to the portion having the defect into a second sector group comprising at least one sector in the data area;

recording the directory corresponding to the data into the first block in the directory area of the medium;

when there is a defect in the first sector group, recording information regarding such a defect into the first block in the directory area; and when only a portion of the information regarding the defect can be recorded into the first block, recording the remaining information regarding the defect into the second block in the directory area, wherein an address of the head defective sector and the number of sectors indicating that defects continuously exist in those sectors when counted from the head defective sector are recorded as the information regarding the defects.

2. A method according to claim 1, further comprising the step of recording a header to distinguish the first and second blocks into a portion of the first and second blocks.

3. A method according to claim 1, further comprising the step of recording concatenation information, indicating that the first and second blocks are concatenated, into a portion of the first and second blocks.

4. A method according to claim 1, wherein the sectors in the data area are arranged on the medium in a predetermined pattern and an address is assigned to each sector.

5. A method according to claim 1, wherein a file name of the data, a file size, an address of the sector at which the recording of the data has been started, and the number of sectors in which the data has been recorded are recorded as the directory.

6. A method according to claim 1, wherein the information recording medium is an optical card.

7. A method according to claim 1, further comprising the step of recording the remaining information regarding the defect into third and fourth blocks in the directory area when no more than a portion of the information regarding the defect can be recorded in the second block.

* * * * *

UNITED STATES PATENT AND TRADEMARK OFFICE
CERTIFICATE OF CORRECTION

PATENT NO. : 5,442,614            Page 1 of 2
DATED : August 15, 1995
INVENTOR(S) : MASAHIRO TAMEGAI It is certified that error appears in the above-indentified patent and that said Letters Patent is hereby corrected as shown below:

<u>COLUMN 1</u>:

Line 42, "$T_4$and" should read --$T_4$ and--.

<u>COLUMN 2</u>:

Line 8, "where in" should read --wherein--.

<u>COLUMN 3</u>:

Line 33, "defect" should read --a defect--.

<u>COLUMN 4</u>:

Line 19, "Mostly)" should read --Many)--.
    Line 45, "of-the" should read --of the--.
    Line 56, "micro processing" should read --microprocessing--.

UNITED STATES PATENT AND TRADEMARK OFFICE
CERTIFICATE OF CORRECTION

PATENT NO. : 5,442,614
DATED : August 15, 1995
INVENTOR(S) : Masahiro Tamegai

It is certified that error appears in the above-indentified patent and that said Letters Patent is hereby corrected as shown below:

Column 5:

Line 22, "formation" should read --information--.

Signed and Sealed this

Fifth Day of December, 1995

*Attest:*

BRUCE LEHMAN

*Attesting Officer*  *Commissioner of Patents and Trademarks*